(12) United States Patent
Suzuki et al.

(10) Patent No.: US 10,311,818 B2
(45) Date of Patent: Jun. 4, 2019

(54) DISPLAY DEVICE

(71) Applicant: Japan Display Inc., Tokyo (JP)

(72) Inventors: Takayuki Suzuki, Tokyo (JP); Hiroyuki Abe, Tokyo (JP)

(73) Assignee: Japan Display Inc., Tokyo (JP)

( * ) Notice: Subject to any disclaimer, the term of this patent is extended or adjusted under 35 U.S.C. 154(b) by 199 days.

(21) Appl. No.: 15/284,627

(22) Filed: Oct. 4, 2016

(65) Prior Publication Data

US 2017/0124977 A1  May 4, 2017

(30) Foreign Application Priority Data

Oct. 30, 2015 (JP) ................ 2015-214354

(51) Int. Cl.
| | |
|---|---|
| *G09G 3/36* | (2006.01) |
| *G11C 19/28* | (2006.01) |
| *G02F 1/1345* | (2006.01) |
| *G02F 1/1368* | (2006.01) |
| *G02F 1/1362* | (2006.01) |

(52) U.S. Cl.
CPC ......... *G09G 3/3677* (2013.01); *G02F 1/1345* (2013.01); *G02F 1/1368* (2013.01); *G11C 19/28* (2013.01); *G02F 1/136286* (2013.01); *G02F 2001/136295* (2013.01); *G02F 2201/56* (2013.01); *G09G 2300/0426* (2013.01); *G09G 2310/0286* (2013.01); *G09G 2310/08* (2013.01)

(58) Field of Classification Search
CPC ............. G02F 1/1345; G02F 1/136286; G02F 1/1368; G02F 2001/136295; G02F 2201/56; G09G 2300/0426; G09G 2310/0286; G09G 2310/08; G09G 3/3677; G11C 19/28

See application file for complete search history.

(56) References Cited

U.S. PATENT DOCUMENTS

| | | | | | |
|---|---|---|---|---|---|
| 8,138,792 | B2 * | 3/2012 | Chang | ............. | G09G 3/006 326/101 |
| 8,334,960 | B2 * | 12/2012 | Yang | ............. | G09G 3/3677 349/149 |
| 2008/0266210 | A1 * | 10/2008 | Nonaka | ............. | G09G 3/20 345/55 |
| 2009/0189835 | A1 * | 7/2009 | Kim | ............. | G09G 3/3677 345/80 |

(Continued)

FOREIGN PATENT DOCUMENTS

| | | |
|---|---|---|
| CN | 102782742 A | 11/2012 |
| JP | 2008-292995 A | 12/2008 |

OTHER PUBLICATIONS

Chinese Office Action dated Jan. 28, 2019 for the corresponding Chinese Patent Application No. 201610969276.X, with translation.

*Primary Examiner* — LaTanya Bibbins
(74) *Attorney, Agent, or Firm* — Typha IP LLC

(57) ABSTRACT

A display device with a variant-shape display region other than the rectangular display region is configured to form a scanning line drive circuit along the variant-shape display region. The scanning line drive circuit includes bus wiring group with clock wiring for supplying clocks with three or more phases and the power supply wiring for supplying power, and the unit circuits for configuring the shift register including five or more transistors. The bus wiring and the unit circuits are formed on the different regions so as not to cross with one another.

12 Claims, 11 Drawing Sheets

(56) References Cited

U.S. PATENT DOCUMENTS

| | | | | |
|---|---|---|---|---|
| 2012/0162179 A1* | 6/2012 | Tanaka | ............. | G09G 3/3677 |
| | | | | 345/211 |
| 2012/0327057 A1* | 12/2012 | Sakamoto | ............ | G11C 19/184 |
| | | | | 345/211 |

\* cited by examiner

DISPLAY DEVICE

CLAIM OF PRIORITY

The present application claims priority from Japanese Patent Application JP 2015-214354 filed on Oct. 30, 2015, the content of which is hereby incorporated by reference into this application.

BACKGROUND

The present invention relates to a display device, and more particularly, to the display device having a display region and an outer shape configured into the shape other than a rectangle.

The liquid crystal display device as one of the display devices includes a TFT substrate having pixels including pixel electrodes and thin film transistors (TFT) arrayed in a matrix, a counter substrate which faces the TFT substrate, and a liquid crystal interposed between the TFT substrate and the counter substrate. An image is formed by controlling the luminous transmittance of liquid crystal molecules for each pixel. The use of the flat and light-weight liquid crystal display device has been extended in various fields.

In most cases, the liquid crystal display device has the display region and the outer shape formed into a rectangle. However, the display device used for the automobile or various types of game machines may be required to have the display region or the outer shape formed into the shape other than a rectangle. Unlike the case of the rectangular display region, the display region shaped other than rectangle may complicate layout of the peripheral drive circuits. Japanese Unexamined Patent Application Publication No. 2008-292995 discloses the structure configured to form the scanning line drive circuit by sequentially repeating the same shift register although the display device is shaped other than a rectangle.

SUMMARY

In the case where the display region is shaped other than a rectangle, layouts of peripheral circuits and wirings which are arranged around the display device will be different from the layout of those on the rectangular display region. The display device shaped other than a rectangle may cause the problem that will be hardly caused by the rectangular display region. The display region shaped other than a rectangle will be referred to as a "variant-shape display region", and the display panel having the outer shape formed other than a rectangle will be referred to as a "variant-shape display panel" hereinafter.

The variant-shape display panel may be mostly demanded to exhibit high resolution. Generally, the resolution in the longitudinal direction of the screen is determined by the number of scanning lines, and the resolution in the lateral direction of the screen is determined by the number of the video signal lines. The scanning line drive circuit is formed by sequentially repeating unit scanning line drive circuit configured as the shift register.

The simplest shift register may include four transistors, a VDD, a VSS, and two clocks (2-phase clock). As the resolution in the longitudinal direction increases, the transistor with additional function is further provided. Alternatively, the clocks with three or more phases may be used for arranging the circuits into the rational layout.

Meanwhile, the display region size is only demanded to be increased while keeping the outer shape size unchanged. In this case, it is necessary to reduce so called the frame width. Although the scanning line drive circuit is formed outside the display region, increase in the number of wirings or transistors makes it difficult to realize the narrow frame. For the purpose of solving the above-described problem, the generally employed rectangular screen is configured to dispose the transistor between the wirings for saving the layout area.

The variant-shape display panel has to be configured to arrange the wiring adapted to the variant-shape display region. Therefore, the layout for the narrow frame of the rectangular screen does not necessarily allow the variant-shape panel to have the narrow frame. It is an object of the present invention to provide the circuit arrangement on the variant-shape display region, which allows the frame to have the narrow width in spite of a large number of the scanning lines.

The present invention is intended to overcome the aforementioned problem by specific structures as described below.

(1) The display device with a variant-shape display region other than a rectangle includes a scanning line drive circuit which is formed adapted to the variant-shape display region. The scanning line drive circuit is constituted of a bus wiring group including clock wirings for supplying clocks with three or more phases and power supply wirings for supplying power, and unit circuits configured as a shift register including five or more transistors. The bus wiring and the unit circuit are formed on different regions, respectively so as not to cross with each other.

(2) The display device as described in (1) is configured to employ the 4-phase clock.

(3) The display device as described in (1) is configured to dispose the unit circuit and the bus wiring group adjacently with each other.

(4) The display device as described in (1) is configured to divide the bus wiring group into a first bus wiring group and a second bus wiring group, between which the unit circuits are disposed.

(5) The display device as described in (1) is configured to form a common wiring between the region where the unit circuit and the bus wiring group are formed, and the variant-shape display region.

(6) The display device as described in (1) is configured to form the unit circuits each having the same layout for constituting the scanning line drive circuit.

(7) The display device as described in any one of (1) to (6) is configured to have the variant-shape display panel having the outer shape other than a rectangle.

(8) The display device as described in any one of (1) to (6) is configured as the liquid crystal display device.

DETAILED DESCRIPTION

The present invention will be described in detail in reference to an embodiment.

First Embodiment

Figure 1:
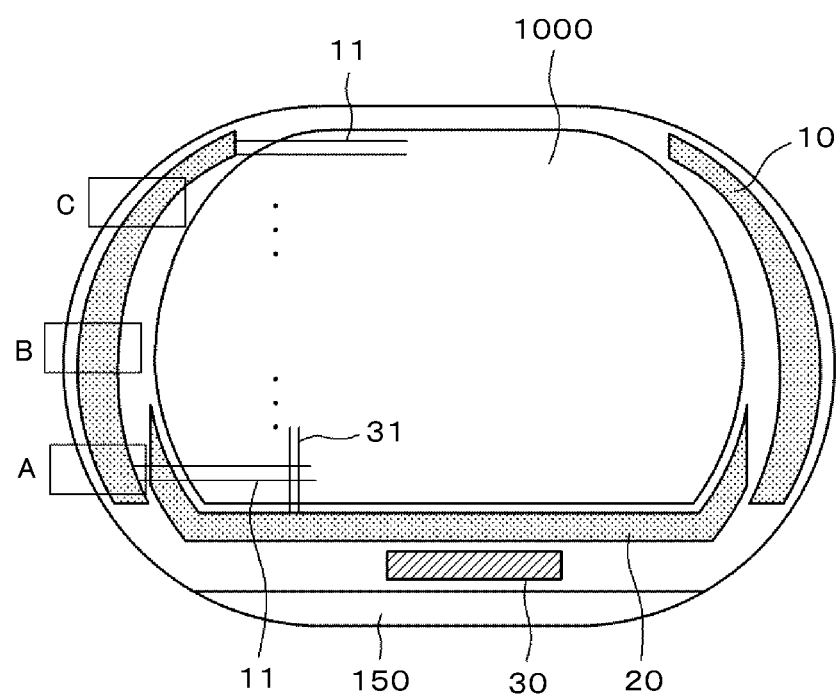
FIG. 1 is a view showing an example of a variant-shape display panel.

FIG. 1 is a view showing an example of the variant-shape display panel. Each of a display region 1000 and an outer shape is formed into a racetrack-like shape including upper and lower linear sides, and left and right curved sides. FIG. 1 is a plan view showing the panel at the side of the TFT substrate having TFT, scanning lines, and video signal lines formed thereon. Referring to FIG. 1, the display region 1000 has laterally extending scanning lines 11, and longitudinally extending video signal lines 31. Pixels are formed in the regions defined by the scanning lines 11 and the video signal lines 31, respectively.

Referring to FIG. 1, a selector 20 and an IC driver 30 are disposed below the display region 1000. A terminal region 150 is disposed outside the IC driver 30 for connection with the flexible wiring substrate. The IC driver 30 supplies video signals to the video signal lines 31 on the display region 31 via the selector 20. The number of the video signal lines 31 corresponds to the number of pixels in the lateral direction of the display region 1000. The number of the signal lines from the IC driver 30 to the selector 20 is ⅓ of the number of the video signal lines, for example. The relationship between the number of the video signal lines, that is, Nd, and the number of the signal lines from the IC driver 30 to the selector 20, that is, Nv may be expressed as Nd/Nv=n, where n denotes an integer equal to or larger than 2. In the case where the number of the video signal lines 31 is increased, the selector 20 serves to save the wiring area by reducing the number of the video signal line lead-out wirings for connection between the IC driver 30 and the video signal line 31. The selector 20 is formed by integrating switches for time-division supplying output signals from the IC driver to the video signal line 30, which may be referred to as an RGB switch. The present invention is applicable to the case without using the selector.

Scanning line drive circuits 10 are disposed at both sides of the display region 1000 for supplying scanning signals to the scanning line 11. The scanning line drive circuit 10 is formed by combining the unit circuits configured as the shift register. The unit circuit is formed for each of the scanning lines 11. The scanning line drive circuit 10 is adaptively formed along the display region 1000.

Figure 2:
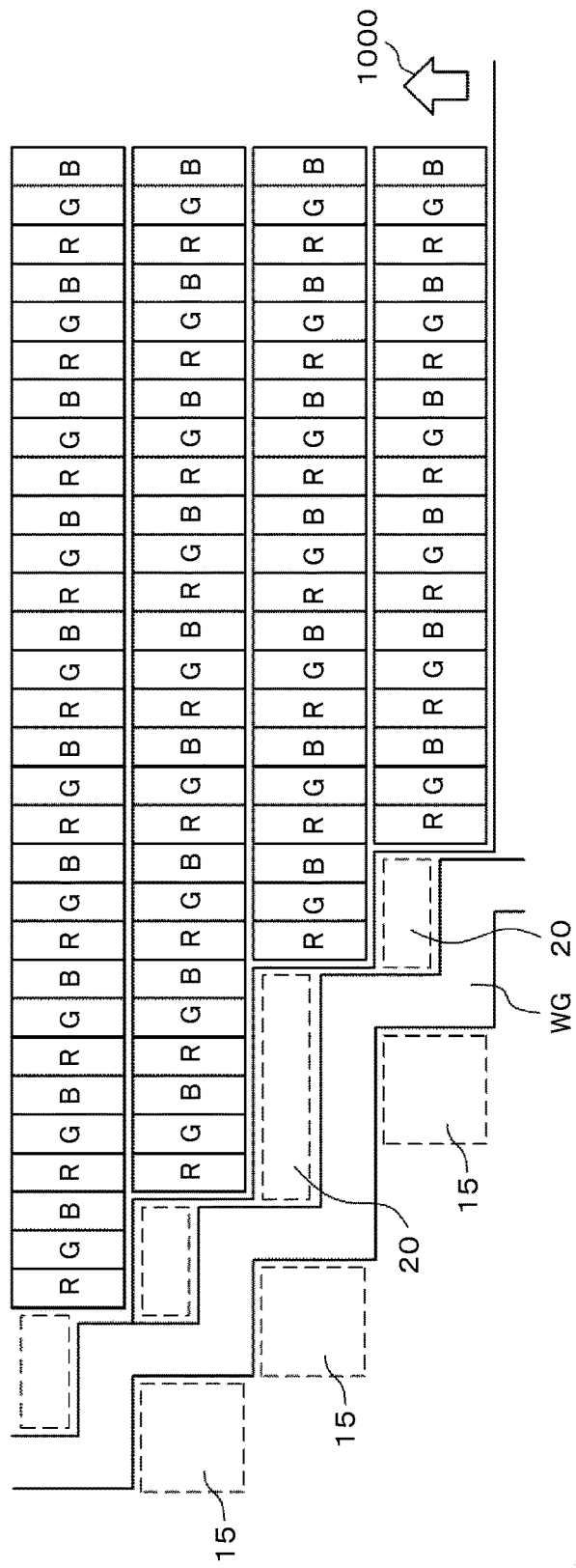
FIG. 2 is a view showing an example of a scanning line drive circuit disposed at the periphery of a variant-shape display region.

FIG. 2 is a view showing an arrangement example of the unit circuits 15 of the variant-shape display panel. The R, G, B shown in FIG. 2 denote red, green, blue pixels, respectively. The unit circuit 15 is disposed in the region surrounded by the dotted line. FIG. 2 is an enlarged view of a left lower end of the display region as shown in FIG. 1. As FIG. 2 shows, upon arrangement of the unit circuits 15 on the variant-shape display panel on the extension of the scanning lines, the wiring for supplying signals to the unit circuits 15 will also be bent adapted to the variant-shape display region. As increase in resolution in the longitudinal direction, the shift register that constitutes the unit circuit is complicated. The number of the clock wirings required for the scanning line drive circuit is also increased. In other words, the simplest shift register may be constituted of four transistors, a VDD, a VSS, and two clocks (2-phase clock). However, as the increase in the number of the scanning lines, there may be the case where the number of the transistors constituting the unit circuit becomes equal to or larger than five, and the number of the clock phases for the scanning line drive circuit becomes equal to or larger than three. The present invention is configured to minimize the area occupied by the scanning line drive circuit on the variant-shape display region in the aforementioned state. There exist the selector SEL for time-division supplying the video signal to the pixel, the video signal line lead-out wiring for connection between the selector SEL and the video signal line drive circuit, and other wirings (FIG. 2 collectively shows those wirings as WG) between the unit circuits and the display region.

Figure 3:
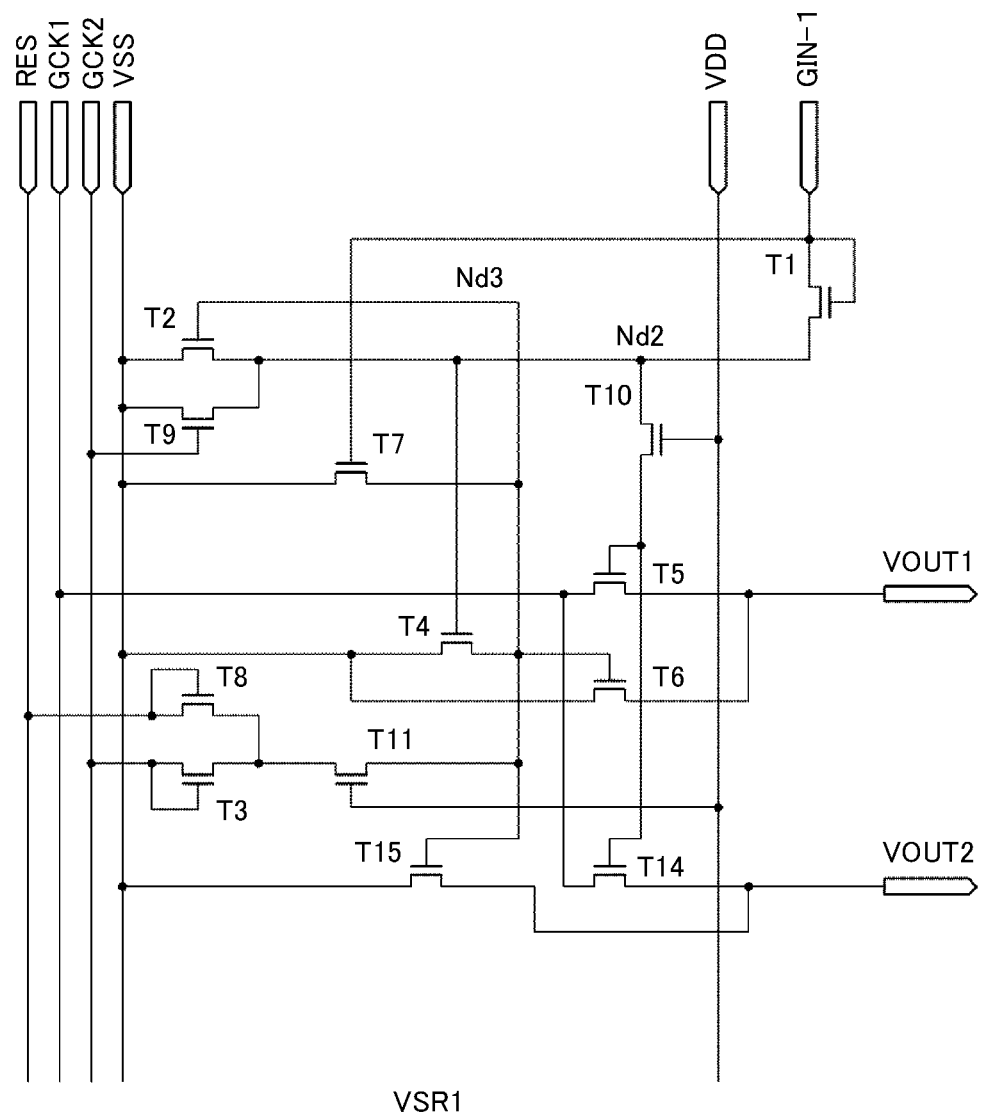
FIG. 3 is a view showing an example of an equivalent circuit of a unit circuit for constituting the scanning line drive circuit.

FIG. 3 is a view showing an example of the unit circuit constituting the shift register. The unit circuit receives the VDD, the VSS, the first clock GCK1, the second clock GCK2, the reset signal RES, and the signal GIN-1 from the previous stage. The unit circuit supplies the scanning signal to the scanning line from VOUT1. The signal is supplied to the unit circuit in the next stage from VOUT2. The VOUT1 and VOUT2 are synchronized. The VDD applies the predetermined voltage to the transistors T10, T11 for maintaining the predetermined voltage between terminals of the transistors T10 and T11 while being kept ON. In the case where each one of terminals of the transistors T10 and T11 is brought into high voltage state, the voltage difference from the other terminal may be alleviated. Generally, the low voltage (Low voltage/ground voltage) is applied to the VSS.

Referring to FIG. 3, upon supply of a reset pulse to the RES, the transistor T8 is turned ON. The ON signal is supplied to the transistor T6 via the transistor T11 so that the low potential VSS is applied to the VOUT 1. The ON signal is also supplied to the transistor T15 via the transistor T11 so that the low potential VSS is applied to the VOUT 2.

As FIG. 3 shows, the scanning signal is supplied to the scanning line in synchronization with the first clock. Upon supply of the pulse from the previous stage to the GIN-1, the transistors T1, T5 are turned ON so that the low potential VSS is applied to the VOUT1. The transistor T14 is turned ON so that the low potential VSS is applied to the VOUT2. Although the terminal GIN-1 is turned OFF, a node Nd2 shown in FIG. 3 is at the potential to be kept ON with respect to the transistors T5, T14.

The aforementioned state represents that the first clock of the GCK1 is supplied to the VOUT1 and the VOUT2. In other words, the first clock pulse is supplied to the VOUT1 as the scanning signal, and simultaneously, supplied to the unit circuit as the shift register at the next stage from the VOUT2. Thereafter, in the case where the second clock of the GCK2 is turned ON, the VSS is applied to the node Nd2. The transistors T5 and 114 are turned OFF so as to be blocked from the GCK1 to which the first pulse is supplied, and the VOUT1, VOUT2.

The transistor T3 is turned ON by turning the second clock ON so that the potential of the second clock is transferred to a node Nd3 via the transistor T11. The transistor T6 is then turned ON to apply the VSS to the VOUT1. Simultaneously, the potential of the node Nd3 turns the transistor T15 ON to apply the VSS to the VOUT2. Every time the second clock is turned ON, the VSS or the low potential is continuously applied to the VOUT1 and the VOUT2.

Each function of the respective transistors as shown in FIG. 3 will be described hereinafter. The T1 denotes the transistor for transferring the signal from the previous stage. The T2 denotes the buffer transistor for fixing the gate of the transistor T5. The T3 denotes the transistor for charging the node Nd3. The T4 denotes the transistor for fixing the output of the gate line to Low. The T5 denotes the buffer transistor for supplying ON signals to the gate line. The T6 denotes the transistor for fixing the gate line to Low in a non-selection state. The T7 denotes the transistor for fixing the node Nd3 to the VSS by the signal (GIN-1) from the previous stage. The T8 denotes the transistor for resetting the node Nd3 to High upon input of the start signal RES. The T9 denotes the buffer transistor for resetting the gate line to Low. The T10 and T11 denote the transistors for alleviating the voltage between terminals. The T14 denotes the buffer transistor for transferring the output to the next stage while the gate signal is ON. The T15 denotes the transistor for fixing the VOUT2 to Low while the gate signal is OFF.

Figure 4:
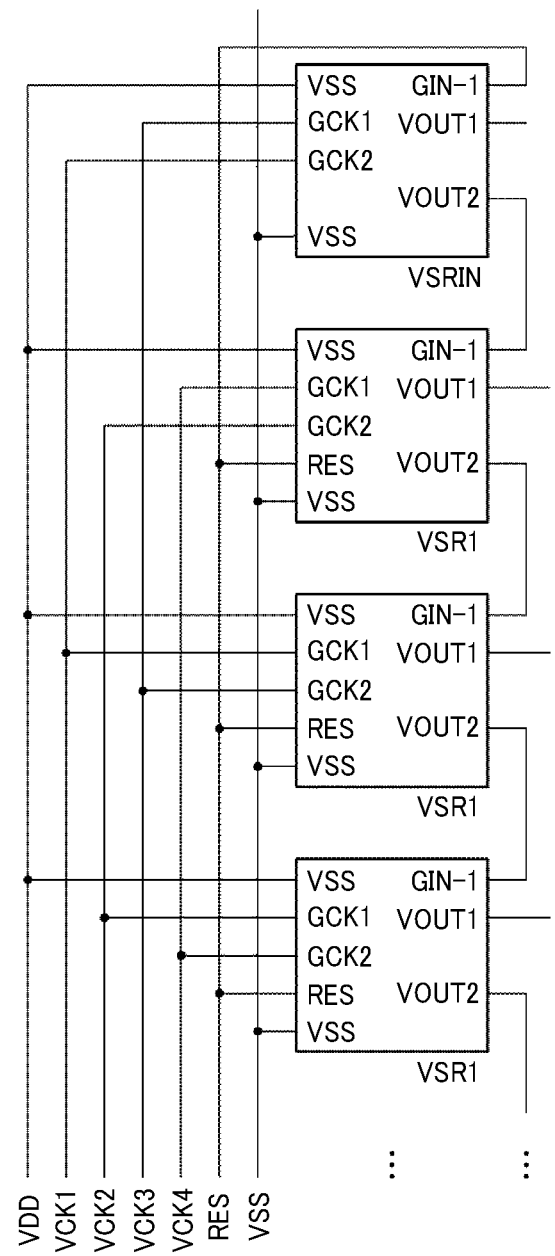
FIG. 4 is a view showing an exemplary structure of the scanning line drive circuit.

The scanning line drive circuit is formed by sequentially repeating the above-described unit circuit by the number corresponding to that of the scanning lines. As the number of the scanning lines increases, the number of the circuits also increases. Three or more clock phases are set for convenience of the layout, from which the required number of clocks for the respective circuit units are taken. FIG. 4 is a view showing an example of the scanning line drive circuit in the case of 4-phase clock.

Referring to FIG. 4, VSRIN denotes the unit circuit at the first stage, and at the second and subsequent stages, VSR1 will be sequentially repeated. As FIG. 4 shows, the RES signal is supplied to the GIN-1 terminal of the VSRIN as the start pulse. The VOUT 2 at the previous stage is supplied to the GIN-1 at the second and subsequent stages. In FIG. 4, the clock pulses each with different phase are supplied to the VCK1, VCK2, VCK3, and VCK4, respectively.

Figure 5:
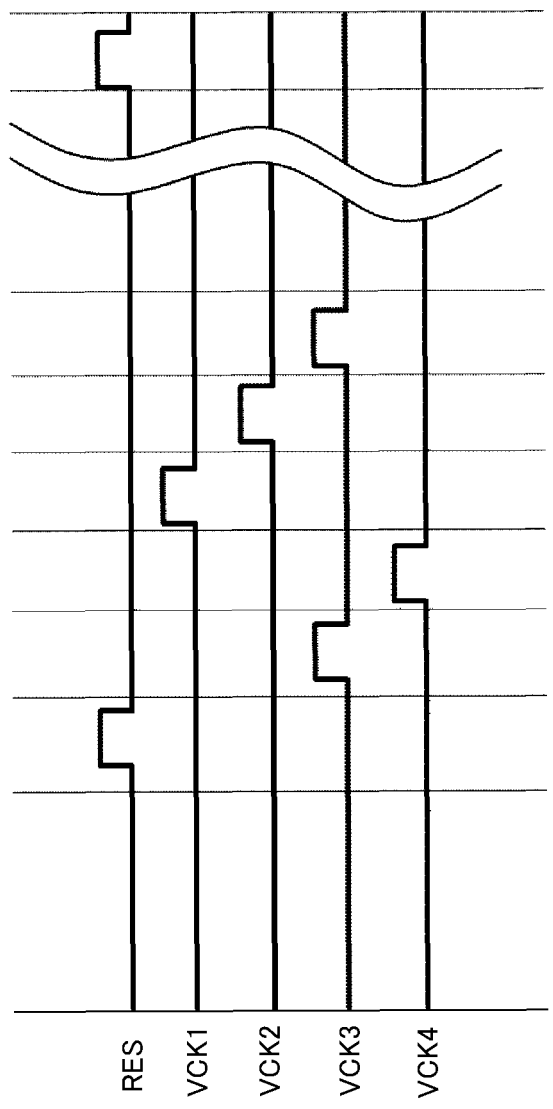
FIG. 5 is a view showing an example of a timing chart in the case of the 4-phase clock supplied to the scanning line drive circuit.

FIG. 5 shows timing charts of the RES as the start pulse, and clock pulses VCK1, VCK2, VCK3, VCK4, respectively. The unit circuit as shown in FIG. 4 employs a pair of VCK1 and VCK3, and a pair of VCK2 and VCK4 corresponding to the GCK1 or GCK2.

Figure 6:
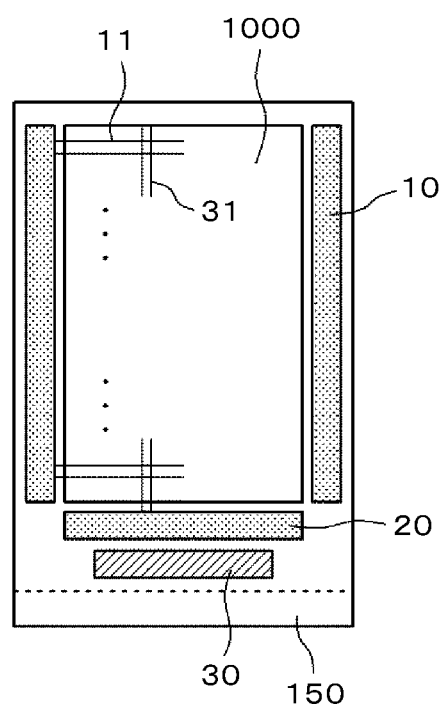
FIG. 6 is a plan view of the display device having the outer shape and the display region both formed into a rectangle.

The circuit arrangement area hardly causes serious problem for the simply structured shift register including four transistors. However, as described referring to FIGS. 3 to 5, high definition screen will increase the number of transistors in the scanning line drive circuit as well as the number of wirings. FIG. 6 is a plan view of the generally employed rectangular liquid crystal display panel. Referring to FIG. 6, the scanning line drive circuits 10 are disposed at both sides of the rectangular display region 1000, and the selector 20, the IC driver 30, and the terminal region 150 are disposed below the display region.

Figure 7:
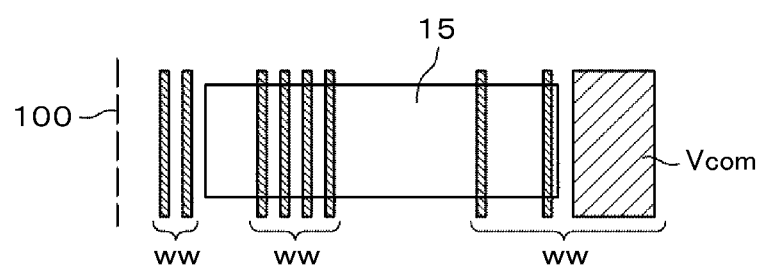
FIG. 7 is a view showing an arrangement example of the bus wiring and the unit circuit in the case of the rectangular display region.

The rectangular panel as shown in FIG. 6 allows well-aligned linear layout of the bus wiring for supplying power or signal to the scanning line drive circuit 10. It is therefore possible to prevent increase in the area of the scanning line drive circuit 10 by arranging the transistors between the bus wirings as shown in FIG. 7. The dashed line 100 of FIG. 7 denotes the end of the panel. In other words, FIG. 7 shows the transistors for constituting the unit circuit which is disposed in the gap between the bus wirings. In the case of the variant-shape panel, the scanning line drive circuit is arranged adapted to the variant-shape display region. Accordingly, the scanning line drive circuit cannot be arranged into the linear formation.

Figure 8:
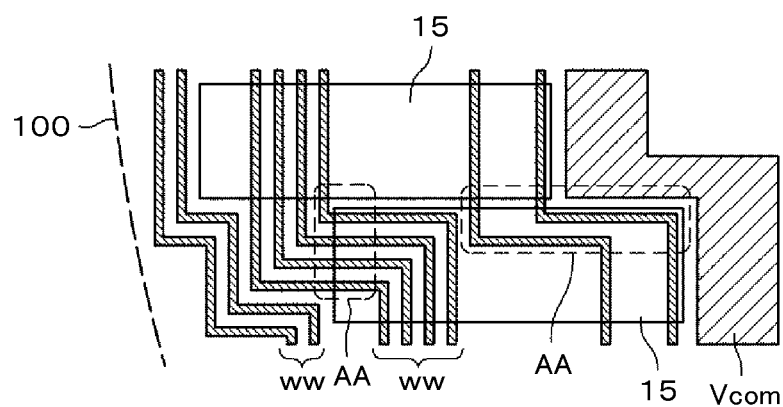
FIG. 8 is a view showing an arrangement example of the unit circuit and the bus wiring of the variant-shape display panel, to which the present invention is not applied.

As a result, as indicated by FIG. 8, the bus wiring has more bent parts. It is difficult to dispose the transistors between the bus wirings with bent parts AA as shown in FIG. 8. The bent part AA in the unit circuit 15 may enlarge the space thereof, leading to increase in the area occupied by the scanning line drive circuit in the end. This may result in increase in the frame region. The dashed line 100 as shown in FIG. 8 denotes the end of the panel.

Figure 9:
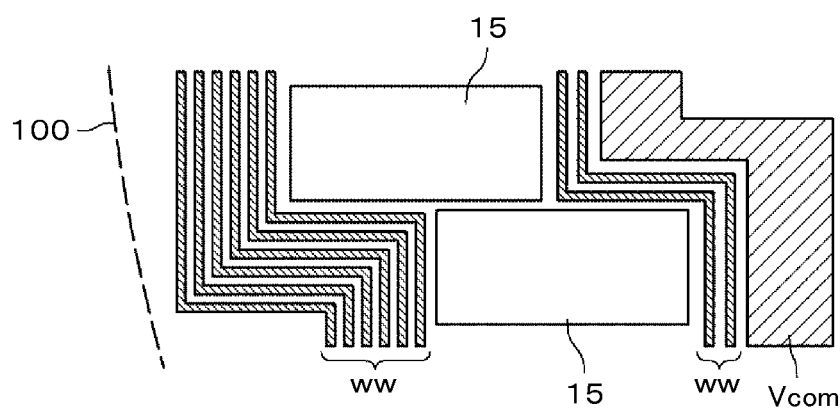
FIG. 9 is a view showing an arrangement example of the unit circuit and the bus wiring according to the present invention.

FIG. 9 is a schematic circuit diagram of the present invention intended to solve the aforementioned problem. Referring to FIG. 9, the unit circuits 15 each including five or more transistors for configuring the shift register are disposed collectively between the bus wirings WW. Referring to FIG. 9, the wiring with large width disposed at the right side applies the common voltage Vcom. The dashed line 100 denotes the end of the panel.

The arrangement as shown in FIG. 9 allows the layout with the smallest area by collectively arranging the bus wirings. The unit circuits 15 may be adaptively positioned to realize the layout with the smallest area. The layout for the overall scanning line drive circuit is ensured to minimize the required area adapted to the shape of the variant-shape display region. The structure as shown in FIG. 9 ensures to form the scanning line drive circuit 10 by sequentially repeating the unit circuit 15 with substantially the same layout. The "substantially the same" represents that, in the case of three or more clock phases, the wiring corresponding to the clock to be used may possibly differ as such clock is different depending on the location of the unit circuit.

Figure 10:
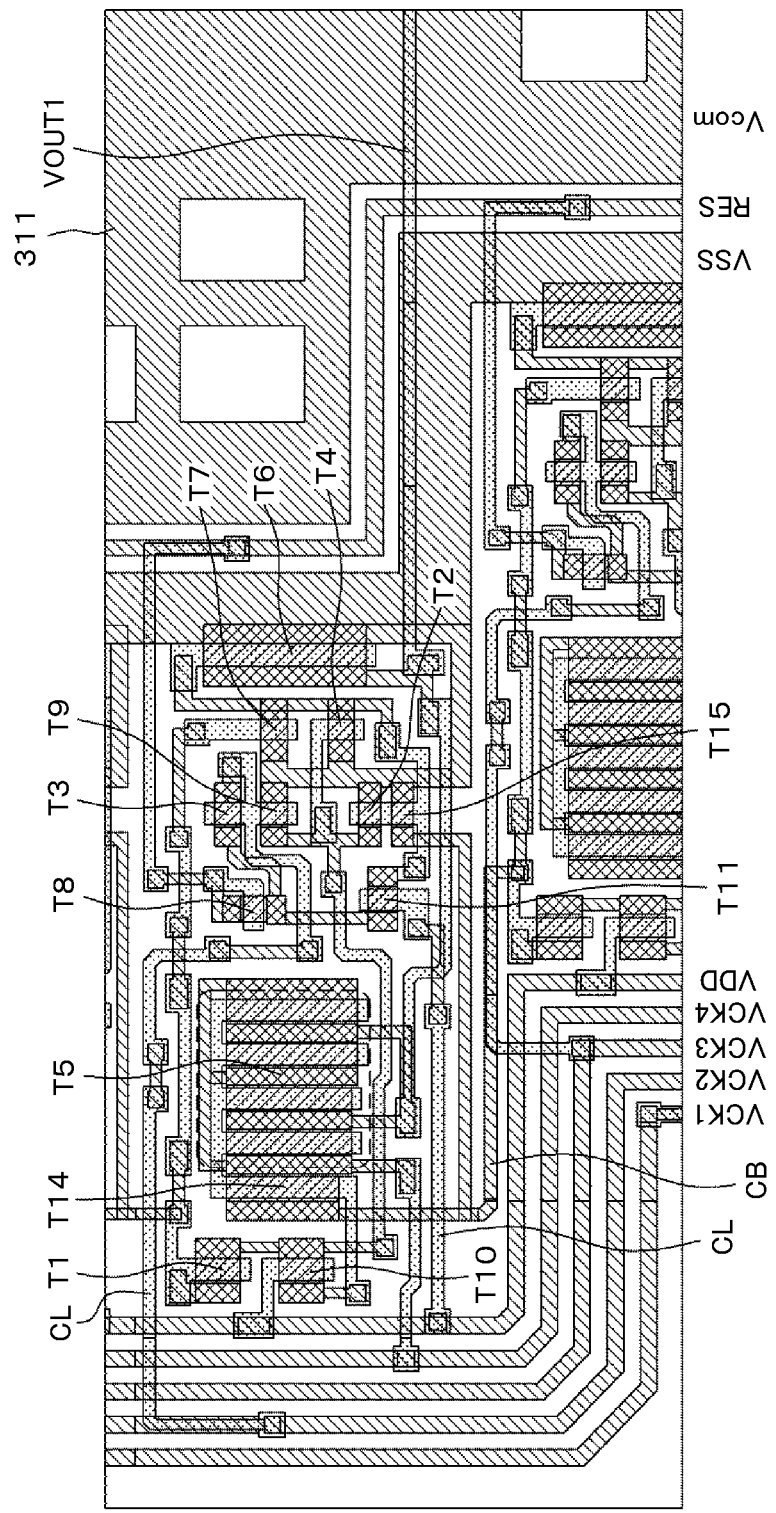
FIG. 10 is a view showing a layout example of the bus wiring and the unit circuit, to which the present invention is applied.

FIG. 10 represents the layout of the unit circuit as shown in FIG. 3 according to the present invention. The transistors T1 to T14 shown in FIG. 10 correspond to those as shown in FIG. 3. Referring to FIG. 10, there are four clock wirings from VCK1 to VCK4. The unit circuit uses the VCK2 corresponding to the GCK2 shown in FIG. 3, and the VCK4 corresponding to the GCK1 shown in FIG. 3. As shown in FIG. 10, the VOUT1 connected to the transistor T5 is connected to the scanning line.

As FIG. 10 shows, the transistors T1 to T14 which constitute the unit circuit are collectively disposed in the same region, and the bus wirings for supplying power and clock to the unit circuit are collectively disposed at both sides while interposing the unit circuit. Referring to FIG. 10, the clock wirings VCK 1 to VCK 4, and the VDD are adjacently disposed at the left side of the unit circuit. The VSS, RES, and Vcom are adjacently disposed at the right side of the unit circuit. The unit circuit and the bus wiring are connected by the connection wiring CL. The adjacent unit circuits are connected via the coupling wiring CB. Those wirings may be determined as required components for the unit circuit. The aforementioned arrangement makes it possible to use the unit circuits each with the same structure.

The right side of FIG. 10 corresponds to the display region, that is, the wide common wiring Vcom exists between the area where the unit circuit and the bus wiring group connected thereto are formed, and the display region. A conductive layer 311 shown in FIG. 10 is formed separately from the layer on which the Vcom is formed, to which the common voltage is applied. It is possible to integrally form the common wiring Vcom and the conductive layer 311. The video signal line lead-out wiring may be disposed between the common wiring Vcom and the display region, or between the conductive layer and the display region. The VSS and Vcom disposed between the scanning line drive circuit and the video signal line lead-out wiring ensure to prevent interference between the video signal and the scanning line drive circuit.

Figure 11:
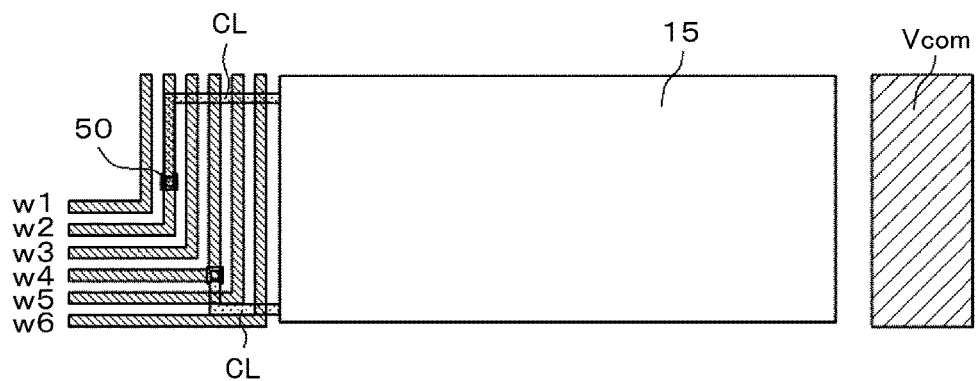
FIG. 11 is a view showing an example of a relationship between the bus wiring and the same unit circuit in use.
Figure 12:
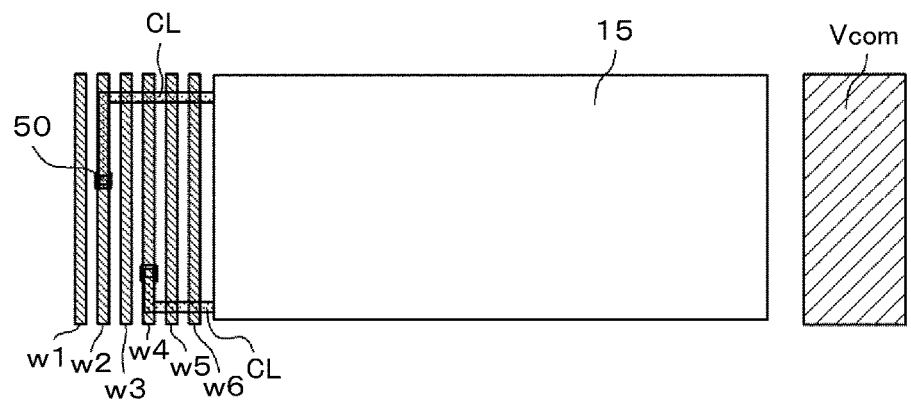
FIG. 12 is a view showing another example of a relationship between the bus wiring and the same unit circuit in use.
Figure 13:
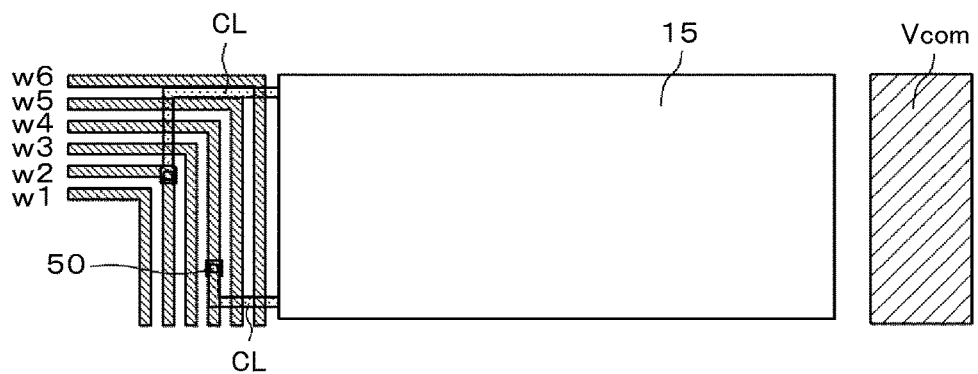
FIG. 13 is a view showing still another example of a relationship between the bus wiring and the same unit circuit in use.
Figure 18:
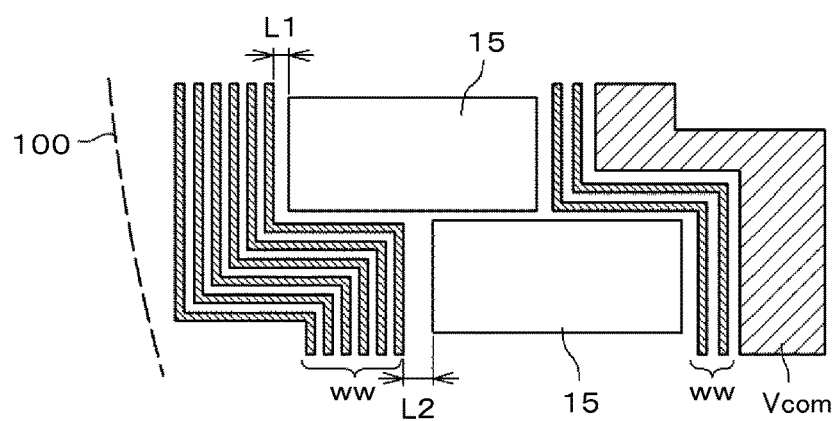
FIG. 18 is a view showing another arrangement example of the unit circuit and the bus wiring according to the present invention.

FIGS. 11, 12, 13 are views showing layout examples of the bus wirings W1 to W6, and the unit circuit 15 in the scanning line drive circuit corresponding to regions A, B, C as shown in FIG. 1, respectively. Referring to FIGS. 11 to 13, six bus wirings (wiring group) W1 to W6 including four clock wirings are disposed at the left side of the unit circuit. The wide Vcom is disposed at the right side of the unit circuit. As FIGS. 11 to 13 show, the layout of the bus wirings W1 to W6 varies with the regions A, B, and C. Upon operation of the unit circuit as shown in FIGS. 11 to 13 with the two same clocks (corresponding to W2 and W4), the unit circuits 15 each with exactly the same layout may be used by changing the position of a contact hole 50. The connection wiring CL for connection between the unit circuit and the bus wiring may be configured to have the same layout. Referring to FIG. 11, the bus wiring laterally extends in the drawing as the first direction, and at the position close to the unit circuit, extends in the longitudinal direction as the second direction. Referring to FIG. 12, the bus wiring extends along the second direction. Referring to FIG. 13, the bus wiring extends from the left side toward the first direction, and is bent toward the second direction. As FIGS. 11 and 13 show, the connection wirings at one side are connected at the position where the bus wiring is bent. In other words, the single connection wiring and one of the bus wirings are connected at the positions where the bus wiring extends along the first direction, and further extends along the second direction. This makes it possible to optimize the bus wiring routing in spite of the common layout of both the unit circuit and the connection wiring. As FIG. 18 shows, it is possible to differ the gaps L1 and L2 between the unit circuit and the bus wiring from each other.

Figure 14:
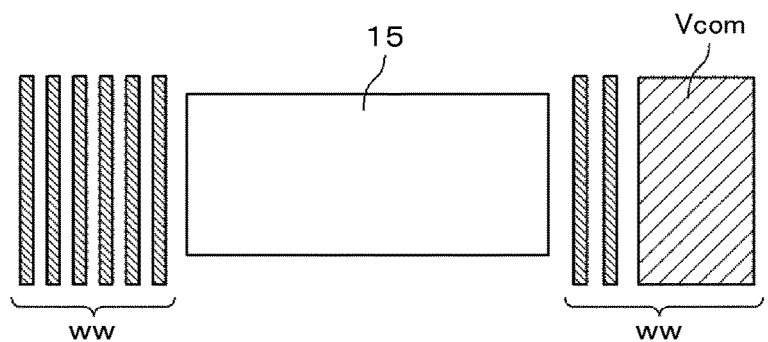
FIG. 14 is a view showing an example of a positional relationship between the unit circuit and the bus wiring.
Figure 15:
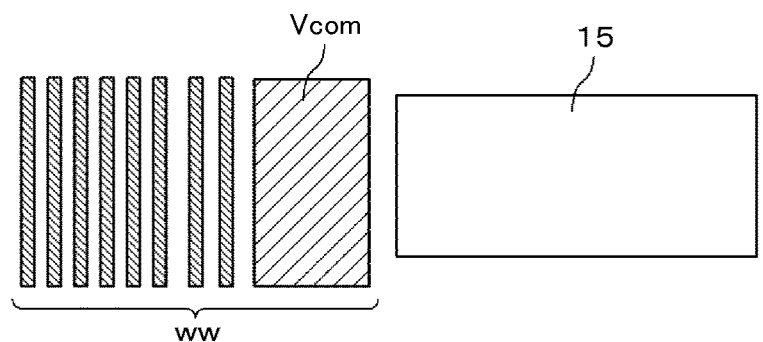
FIG. 15 is a view showing another example of the positional relationship between the unit circuit and the bus wiring.
Figure 16:
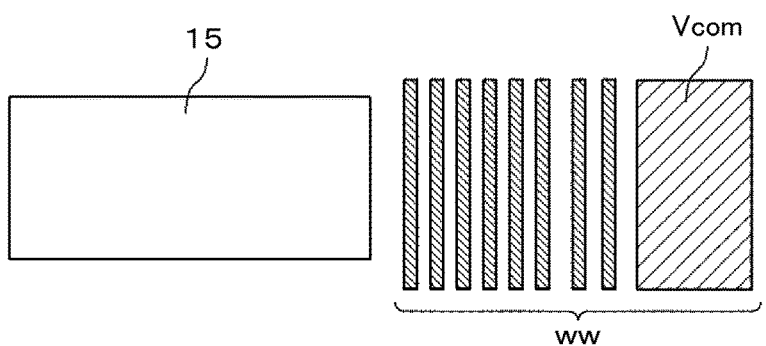
FIG. 16 is a view showing still another example of the positional relationship between the unit circuit and the bus wiring.

The present invention is configured to collectively dispose the bus wirings which supply signals or power to drive the scanning line drive circuit 10 so that the components of the respective unit circuits for constituting the scanning line drive circuit are collectively disposed. FIGS. 14 to 16 show arrangement examples of the adjacently disposed bus wirings WW and the unit circuit 15. FIG. 14 shows an exemplary arrangement that the bus wirings WW are divided into two bus wiring groups, between which the adjacently disposed unit circuits 15 are interposed. FIG. 15 shows an exemplary arrangement that the bus wirings WW are collected to the single bus wiring group so as to be disposed to the left of the adjacently disposed unit circuits 15. FIG. 16 shows an exemplary arrangement that the bus wirings WW are collected to the single bus wiring group so as to be disposed to the right of the adjacently disposed unit circuits 15. The present invention allows the variant-shape display panel to easily dispose the scanning line drive circuit 10 adapted to the variant-shape display region with various shapes. This makes it possible to reduce the frame region.

Figure 17:
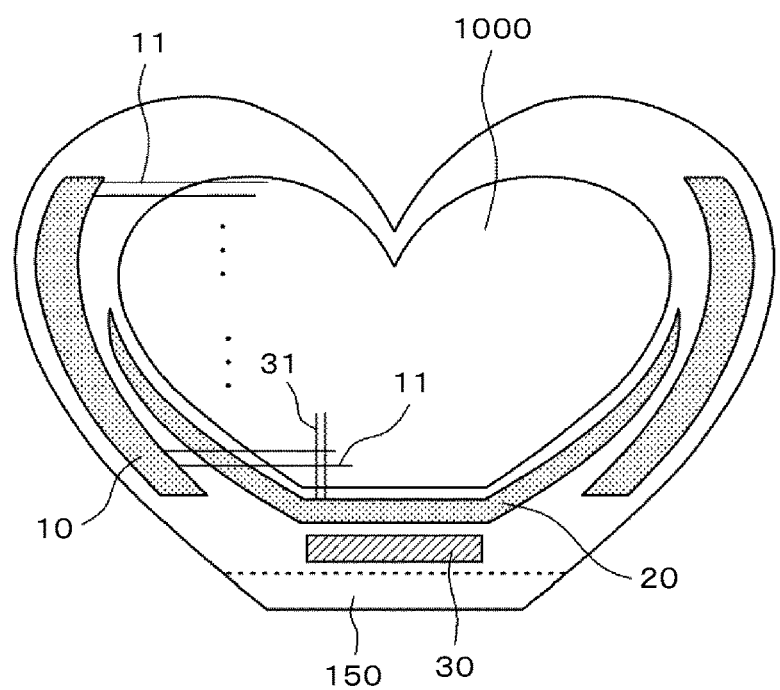
FIG. 17 is a view showing another example of the variant-shape display panel.

The present invention has been described, taking the variant-shape display panel as an example. The present invention may be applied to the variant-shape display panel with any other shape as shown in FIG. 17 without being limited to the one as shown in FIG. 1. The present invention may be applied to the organic EL display device in addition to the liquid crystal display device.

What is claimed is:

1. A display device including a substrate on which a display region and a peripheral region having a scanning line drive circuit, wherein:
   the scanning line drive circuit includes a first wiring group having a clock wirings supplying clock and a first power wiring supplying power, a second wiring group having a second power wiring supplying power, and a plurality of unit circuits including five or more transistors;
   the unit circuits are located between the first wiring group and the second wiring group at the peripheral region in a plan view;
   the second wiring group locates between the unit circuits and the display region in the plan view;
   the first power wiring is the closest to the unit circuits among the first wiring group in the plan view;
   the second power wiring is the closet to the unit circuits among the second wiring group in the plan view; and
   the clock wirings disposed between the first power line and an end of the substrate in the plan view,
   wherein
   the unit circuits have a first unit circuit and a second unit circuit adjacent to the first unit circuit,
   the first unit circuit and the second unit circuit are connected via a coupling wiring,
   the coupling wiring locates between the first power wiring and the second power wiring in the plan view, and
   the first unit circuit and the second unit circuit are adjacent to each other in a second direction, and the second unit circuit is shifted from the first unit circuit in a first direction which crosses the second direction.

2. The display device according to claim 1, wherein a common wiring is formed between the second wiring group and the display region.

3. The display device according to claim 1, wherein:
   a common wiring is formed between the second wiring group and the display region,
   the second wiring group has a reset wiring supplying a reset signal to the unit circuits, and
   the reset wiring is located between the second power wiring and the common wiring in the plan view.

4. The display device according to claim 3, wherein a first width of the first unit circuit between the first power wiring and the second power wiring in the first direction is substantially same as a second width of the second unit circuit between the first power wiring and the second power wiring in the first direction.

5. The display device according to claim 4, wherein each of the unit circuits includes a plurality of connection wirings for connection with the wiring group.

6. The display device according to claim 5, wherein:
each of the clock wirings includes a X part extending along the first direction and a Y part extending along a second direction different from the first direction;
a first connection wiring of the connection wirings for connection between the first unit circuit and a first clock wiring of the clock wirings is connected to the Y part of the first clock wiring, which extends along the second direction; and
a second connection wiring of the connection wirings for connection between the second unit circuit, which is different from the first unit circuit, and a second clock wiring of the clock wirings is connected to the X part of the second clock wiring, which extends along the first direction.

7. The display device according to claim 5, wherein:
a first clock wiring of the clock wirings includes a X part extending along the first direction and a Y part extending along the second direction different from the first direction;
a first connection wiring of the connection wirings has a X part extending along the first direction and a Y part extending along the second direction,
wherein the Y part of the first connection wiring connects with the Y part of the first clock wiring, the X part of the first connection wiring connects with the first unit circuit, and
wherein a transistor of the first unit circuit is located between the X part of the first connection wiring and the coupling wiring in the second direction in the plan view.

8. The display device according to claim 7, wherein the substrate has an outer shape other than a rectangular outer shape.

9. The display device according to claim 8, wherein the display device is a liquid crystal display device.

10. The display device according to claim 4, wherein
a width of the first power wiring in the first direction is smaller than a width of the second power wiring in the first direction, and
a width of the common wiring in the first direction is larger than the width of the second power wiring in the first direction.

11. The display device according to claim 1, wherein each of the unit circuits has the same layout.

12. The display device according to claim 1, wherein the display device has a variant-shape display region other than a rectangular display region.

* * * * *